(12) United States Patent
Okino

(10) Patent No.: US 6,207,962 B1
(45) Date of Patent: Mar. 27, 2001

(54) CHARGED-PARTICLE-BEAM MICROLITHOGRAPHY APPARATUS AND METHODS EXHIBITING REDUCED THERMAL DEFORMATION OF MARK-DEFINING MEMBER

(75) Inventor: Teruaki Okino, Kamakura (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/326,484

(22) Filed: Jun. 4, 1999

(30) Foreign Application Priority Data

Jun. 5, 1998 (JP) .................................................. 10-172113

(51) Int. Cl.[7] .............................. G21K 4/00; G21K 1/02
(52) U.S. Cl. .................................. 250/492.2; 250/492.22; 250/492.1; 250/492.23
(58) Field of Search ........................... 250/492.2, 492.22, 250/492.23, 492.1

(56) References Cited

U.S. PATENT DOCUMENTS 5,557,314 * 9/1996 Okamoto et al. .................... 347/230

5,888,682 * 3/1999 Nakasuji ............................... 430/22

FOREIGN PATENT DOCUMENTS 9-232209    5/1997 (JP) .

* cited by examiner

*Primary Examiner*—Bruce C. Anderson
*Assistant Examiner*—Nikita Wells
(74) *Attorney, Agent, or Firm*—Klarquist Sparkman Campbell Leigh & Whinston LLP

(57) ABSTRACT

Methods and apparatus are disclosed for reducing thermal deformation of "upstream" marks (as used for alignment and/or calibration) situated on a reticle or on a reticle plane (e.g., on the reticle stage), thereby facilitating more accurate transfer of the reticle pattern to a sensitized substrate (e.g., semiconductor wafer) using a charged particle beam (e.g., electron beam). The charged particle beam illuminates an upstream mark situated on the reticle or on a reticle plane and projects an image of the illuminated upstream mark onto a corresponding "downstream" mark situated on a substrate plane. A shield is situated upstream of the upstream mark and serves to block downstream passage of the charged particle beam except to illuminate the upstream mark or a portion of the upstream mark. The upstream mark can be situated on the reticle or on a mark member situated in the reticle plane.

9 Claims, 3 Drawing Sheets

CHARGED-PARTICLE-BEAM MICROLITHOGRAPHY APPARATUS AND METHODS EXHIBITING REDUCED THERMAL DEFORMATION OF MARK-DEFINING MEMBER

FIELD OF THE INVENTION

The present invention pertains, inter alia, to charged-particle-beam (CPB) microlithography apparatus and methods as used for transferring a pattern, defined on a reticle, to a sensitized substrate. Such apparatus and methods have especial utility in the manufacture of integrated circuits, displays, and the like. The invention also pertains to methods and apparatus for calibrating and adjusting a CPB projection-optical system and for aligning the substrate and reticle with each other for accurate pattern transfer. The invention also pertains to methods and apparatus for reducing thermal deformation of a member, such as the reticle or a movable stage, that defines an alignment or calibration mark.

As used herein, the term "reticle" pertains not only to reticles and masks that define an actual pattern to be transferred to a substrate, but also to aperture plates and the like as used in, for example: variable-shaped-beam projection-exposure systems, character projection systems, and "divided" projection-exposure systems. In "divided" projection-exposure systems, the reticle is divided or segmented into multiple "exposure units" (e.g., subfields, stripes, or other subdivisions) that are exposed individually and sequentially onto the substrate on which the images of individual exposure units are "stitched" together contiguously to form the complete pattern on the substrate.

BACKGROUND OF THE INVENTION

Various methods and apparatus are under current research and development for transferring, using a charged particle beam, a pattern defined by a reticle or mask onto a sensitized substrate by microlithography. Representative charged particle beams used in such systems include electron beams and ion beams. Electron-beam systems have been the subject of most such effort; hence, the following summary is in the context of electron-beam systems.

Charged-particle-beam (CPB) microlithography systems, such as electron-beam writing systems, offer tantalizing prospects of improved accuracy and resolution of pattern transfer, but exhibit disappointingly low throughput. Consequently, much contemporary research and development has focused on overcoming this disadvantage. Examples of various conventional approaches include "cell-projection," "character projection," and "block projection" (collectively termed "partial-block" pattern transfer).

Partial-block pattern transfer is used especially whenever the pattern to be transferred to the substrate comprises a region in which a basic pattern unit is repeated many times. For example, partial-block pattern transfer is used generally for patterns having large memory circuits, such as DRAMs. In such patterns, the basic pattern unit is very small, having measurements on the substrate of, for example, $(10\ \mu m)^2$ (i.e., $10\ \mu m \times 10\ \mu m$). The basic pattern unit is defined on one or several exposure units on the reticle and the exposure units are repeatedly exposed many times onto the substrate to form the pattern on the substrate. Unfortunately, partial-block pattern transfer tends to be employed only for repeated portions of the pattern. Portions of the pattern that are not repeated are transferred onto the substrate using a different method, such as the variable-shaped-beam method. Therefore, partial-block pattern-transfer has a throughput that is too low, especially for large-scale production of integrated circuits.

A conventional approach that has been investigated in an effort to achieve a higher throughput than partial-block pattern-transfer methods is a projection microlithography method in which the entire reticle pattern for a complete die (or even multiple dies) is projection-exposed onto the substrate in a single "shot." In such a method, the reticle defines a complete pattern, such as for a particular layer in an entire integrated circuit. The image of the reticle pattern as formed on the substrate is "demagnified" by which is meant that the image is smaller than the pattern on the reticle by a "demagnification factor" (typically 4:1 or 5:1). To form the image on the substrate, a projection lens is situated between the reticle and the substrate. Whereas this approach offers prospects of excellent throughput, it to date has exhibited excessive aberrations and the like, especially of peripheral regions of the projected pattern. In addition, it is extremely difficult to manufacture a reticle defining an entire pattern that can be exposed in one shot.

Yet another approach that is receiving much current attention is the "divided" or "partitioned" projection-exposure approach that utilizes a "divided," "partitioned," or "segmented" reticle. On such a reticle, the overall reticle pattern is subdivided into portions termed herein "exposure units." The exposure units can be of any of various types termed "subfields," "stripes," etc., as known in the art. Each exposure unit is exposed individually and sequentially in a separate "shot" or scan. The image of each exposure unit is projection-exposed (typically at a demagnification ratio such as 4:1 or 5:1) using a projection-optical system situated between the reticle and the substrate. Even though the projection-optical system typically has a large optical field, distortions, focal-point errors and other aberrations, and other faults in projected images of the exposure units are generally well controlled. Although divided projection-exposure systems provide lower throughput than systems that expose the entire reticle in one shot, divided projection-exposure systems exhibit better exposure accuracy and image resolution.

In divided projection exposure, it is necessary to achieve very accurate alignment of the reticle with the substrate to ensure that the images of the exposure units are positioned at the respective locations on the reticle with extremely high accuracy. To such end, an operation termed "mark detection" is performed such as during calibration of the optical system and when aligning the substrate with the reticle before exposing an exposure unit onto the substrate. During mark detection, an image of one or more "upstream" marks provided on the reticle or other location on the reticle stage is projected onto a corresponding "downstream" mark provided on the substrate or other location on the substrate stage. The marks are scanned relative to each other to determine the relative positions of the marks.

Systems designed for high-resolution pattern transfer, such as the divided projection-exposure system summarized above, employ very large acceleration voltages such as between the CPB source and the reticle. To achieve the requisite high accuracy of mark detection, either mark scanning must be performed relatively slowly or a large number of scans must be performed. Consequently, the cumulative beam energy that strikes the marks and their immediate surrounding area is very high. This energy usually is dissipated as localized heating which elevates the temperature and causes thermal deformation of the vicinity of the marks. Such deformation degrades the accuracy with which mark positions can be determined, reduces calibration and alignment accuracy, and reduces the accuracy with which images of exposure units on the substrate can be stitched together. The resulting devices manufactured under such conditions exhibit a higher incidence of defects such as shorts, opens, and non-uniform resistance values.

SUMMARY OF THE INVENTION

The present invention solves certain of the problems of conventional apparatus and methods summarized above and thereby provides more accurate transfer of a reticle pattern to a substrate.

According to a first aspect of the invention, charged-particle-beam (CPB) microlithography (projection-exposure or projection-transfer) apparatus are provided. According to a representative embodiment, such an apparatus comprises an illumination optical system situated and configured to direct a charged-particle illumination beam along an optical axis from a source to a selected region on a reticle. The reticle is situated at a reticle plane orthogonal to the optical axis. The apparatus also comprises a projection-optical system situated and configured to direct a charged-particle imaging beam from the reticle to a sensitized substrate so as to transfer the pattern portion defined by the selected exposure unit to the substrate. An "upstream" mark is situated on the reticle plane so as to be irradiated selectively by the illumination beam. A shield is situated between the source and the upstream mark. The shield defines an aperture that transmits a portion of the illumination beam to the upstream mark while blocking other portions of the illumination beam from reaching the reticle plane.

In the embodiment summarized above, the upstream mark can be situated on the reticle. In such an instance, the reticle can comprise multiple upstream marks distributed over the reticle. In such a configuration, the shield desirably defines multiple apertures each corresponding to a respective individual upstream mark on the reticle.

Alternatively, the upstream mark can be situated on a mark member separate from the reticle. In such a configuration, the shield desirably extends over the mark member. This configuration usually is used for calibration of the optics of the CPB projection-exposure apparatus.

The upstream mark can comprise multiple mark portions. In such an instance, the aperture defined by the shield can be sized, whenever the aperture is axially registered with the upstream mark, to circumscribe all the mark portions collectively. Alternatively, the shield can define multiple apertures each corresponding to a respective individual mark portion.

According to another aspect of the invention, CPB microlithography methods are provided in which a charged-particle illumination beam is used to irradiate a portion of a pattern defined by a reticle situated on a reticle plane. A projection-optical system is used to direct a corresponding charged-particle imaging beam from the irradiated portion to a sensitized substrate situated on a substrate plane. An upstream mark is defined on the reticle plane and a "downstream" mark is defined on the substrate plane. The upstream mark is registrable selectively with the downstream mark to perform beam alignment. A shield is provided upstream of the upstream mark. The shield (a) serves to block downstream passage of the illumination beam, and (b) defines an aperture having a size and profile sufficient to pass therethrough only a portion of the illumination beam sufficient to irradiate the upstream mark. When irradiating the upstream mark with the illumination beam, the illumination beam is passed through the aperture of the shield before the illumination beam reaches the upstream mark. The upstream mark can be defined on the reticle, in which instance the shield desirably extends over the reticle. Alternatively, the upstream mark can be defined on a mark member (which can be separate from the reticle), in which instance the shield desirably extends over the mark member.

In conventional CPB projection-exposure systems having utility for, e.g., performing "divided" projection exposure, the illumination beam as incident on the reticle can have a transverse profile that is relatively large (e.g., $(100 \,\mu m)^2$–$(1000 \,\mu m)^2$). A typical upstream mark is much smaller, on the order of a few $\mu$m square to about a hundred $\mu$m square. Whenever such upstream marks are illuminated by the charged particle beam during calibration or alignment, the beam that strikes the upstream mark is much larger in transverse area than required for illuminating the upstream mark. As summarized above, the resulting large amount of energy being dissipated in an area surrounding the upstream mark can cause thermal deformation of the upstream marks. Whereas it might be possible to reduce the transverse area of the beam, such a method is impractical because it requires a very complex irradiation optical system. Apparatus and methods according to the invention, as summarized above, reduce the transverse area of the illumination beam actually irradiating an upstream mark, thereby largely eliminating thermal deformation of the mark(s).

The foregoing and additional features and advantages of the invention will be more readily apparent from the following detailed description, which proceeds with reference to the accompanying drawings.

DETAILED DESCRIPTION

Figure 5:
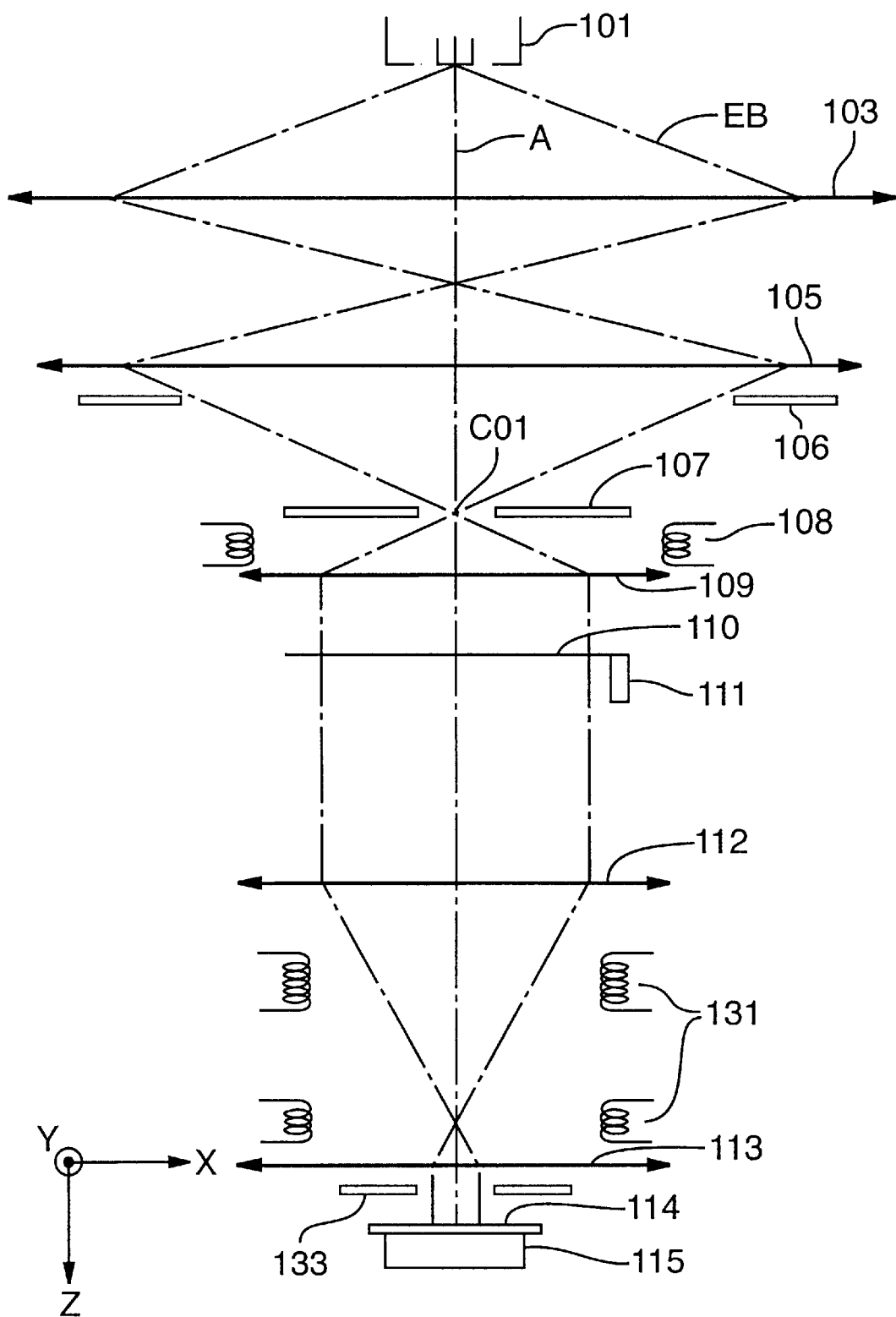
FIG. 5 is an elevational schematic drawing showing certain imaging relationships in an embodiment of an electron-beam projection-exposure system according to the invention.

Reference is first made to FIG. 5 which depicts a representative embodiment of a charged-particle-beam (CPB) projection-exposure apparatus that can include the instant invention. The FIG. 5 embodiment is discussed below in the context of an electron-beam system, but it will be understood that any of various other charged particle beams can be used with such an apparatus, such as an ion beam.

In FIG. 5, an electron gun 101 produces an electron beam EB that propagates in a downstream direction along an optical axis A. The electron beam EB propagates from the electron gun 101 through various components (discussed below) to a reticle 110 and then through other components (discussed below) to a substrate 114.

Downstream of the electron gun 101 are situated a first condenser lens 103 and a second condenser lens 105. The electron beam EB passes through the condenser lenses 103, 105 and is converged at a crossover image C01. Downstream of the second condenser lens 105 is a beam-shaping aperture 106. The beam-shaping aperture 106 trims the electron beam EB to have a transverse profile suitable for illuminating an individual exposure unit on the downstream reticle 110.

Desirably, the beam-shaping aperture 106 trims the electron beam EB to have a transverse profile slightly larger than the area and profile of the exposure unit. For example, the beam-shaping aperture 106 can shape the electron beam to have a square profile measuring slightly more than one millimeter on a side as projected onto the reticle 110, for illuminating an exposure unit measuring exactly 1 mm square.

A blanking aperture 107 is situated at the same axial position, downstream of the beam-shaping aperture 106, as the crossover image C01. Immediately downstream of the blanking aperture 107 is a deflector 108. A collimating lens 109 forms an image of the beam-shaping aperture 106 on the illuminated exposure unit on the reticle 110.

As used herein, an "illumination beam" denotes the charged particle beam EB between the electron gun 101and the reticle 110, and an "imaging beam" denotes the charged particle beam between the reticle 110 and the substrate 114. Similarly, the "illumination-optical system" denotes the optical system located between the source 101 and the reticle 110, and the "projection-optical system" denotes the optical system located between the reticle 110 and the substrate 114.

The deflector 108 sequentially scans the electron beam EB primarily in the X direction of FIG. 5 so as to illuminate, within the optical field of the illumination-optical system, a desired exposure unit on the reticle 110.

With respect to the reticle 110, although only one exposure unit (through which the optical axis A passes) is shown in FIG. 5, the reticle 110 actually extends outward in the X-Y plane (perpendicular to the optical axis) and typically comprises a large number of exposure units. As the exposure units are sequentially illuminated by the electron beam, the deflector 108 scans the electron beam, as discussed above, across the optical field of the illumination-optical system.

Provided downstream of the reticle 110 are first and second projection lenses 112 and 113 and, respectively, a deflector 131. The projection lenses preferably are configured as a "Symmetric Magnetic Doublet" or "SMD." As each exposure unit on the reticle 110 is illuminated by the illumination beam, the beam passes through the illuminated exposure unit and thus acquires an ability to form an image of the illuminated exposure unit. The resulting imaging beam is demagnified by passage through the projection lenses 112, 113 and deflected as required by the deflectors 131 to form an image of the illuminated exposure unit at the desired location on the substrate 114.

The reticle 110 is mounted on a reticle stage 111 that is movable within an X-Y plane. In a similar manner, the substrate (e.g., a semiconductor wafer) 114 is mounted on a wafer stage 115 that is also movable within a respective X-Y plane. Hence, continuous scanning of the exposure units of the reticle pattern can be performed (assuming the projection lenses 112, 113 are configured as an SMD) by scanning the reticle stage 111 and the wafer stage 115 in opposite directions along the Y axis. Both the reticle stage 111 and wafer stage 115 include highly accurate position-measurement systems employing laser interferometers as known in the art. The position-measurement systems, in concert with beam alignments and adjustments performed by the various deflectors of the illumination and projection optical systems, enable the images of the exposure units as formed on the substrate 114 to be accurately stitched together.

The upstream-facing surface of the substrate 114 is coated with a suitable resist so as to be imprintable with the projected image of the substrate pattern. To effect such imprinting, the substrate 114 must be exposed with a proper dosage of the imaging beam.

Situated upstream of the substrate 114 is a backscattered-electron detector 133 used for mark detection, as discussed below.

Figure 1:
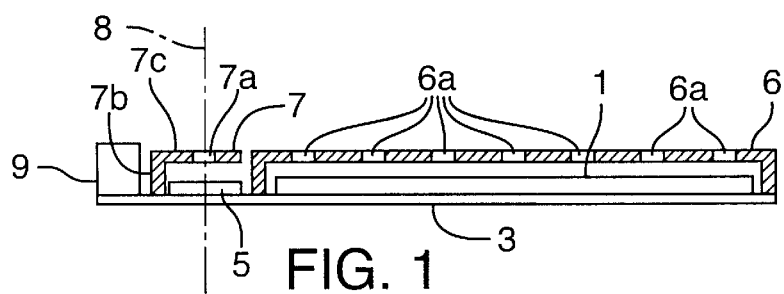
FIG. 1 is an elevational section showing certain details of a reticle and reticle stage of a charged-particle-beam (CPB) projection-exposure system according to a first representative embodiment of the present invention.

FIG. 1 shows the vicinity of a reticle stage according to a first representative embodiment of the invention. As shown in FIG. 1, a reticle 1 is mounted on a reticle stage 3. A mark member 5 is situated adjacent the reticle on the reticle stage 3. The upstream-facing surfaces of the mark member 5 and the reticle 1are desirably co-planar in a "reticle plane" that is orthogonal to the optical axis. The mark member 5 desirably is made of silicon about 800 μm in thickness and defines one or more "upstream" marks, such as shown in FIGS. 2(A)–2(D), useful for alignment and calibration purposes, for example. Whenever the charged particle beam 8 impinges on an upstream mark, some of the particles in the beam pass through the upstream mark and are projected onto a respective region on the substrate or wafer stage. The upstream-facing surface on the substrate or on the wafer stage where the upstream mark is projected desirably is situated in a "substrate plane" orthogonal to the optical axis.

Situated upstream of the mark member 5 is a shield 7. The shield 7 desirably is made of an electrically conductive material such as tantalum or molybdenum having a thickness of approximately 0.1 to 1 mm in this embodiment. The shield 7 is supported relative to the reticle stage 3 by a leg portion 7b from which a shield plate 7c extends in a cantilever manner so as to cover the mark member 5. The gap between the mark member 5 and the shield 7 is desirably within the range of approximately 0.1 mm to several mm. Alternatively, a separate leg portion 7b can be placed along each of at least two edges of the shield plate 7c, or the shield plate can be supported relative to the reticle stage 3 in any of various other suitable ways. Flanking the shield 7b is a laser mirror 9 used by the position-measurement system of the reticle stage discussed above.

The shield plate 7c defines an aperture 7a that is desirably slightly larger than the upstream mark on the mark member 5. The aperture 7a desirably is located in the center of the shield plate 7c and axially registered with the upstream mark on the mark member 5. The aperture 7a is discussed further below, with reference to FIGS. 3(A) and 3(B).

The reticle 1 also can be covered with a shield 6 that defines apertures 6a in locations on the shield 6 that correspond to the locations of corresponding upstream marks on the reticle 1.

Figure 2A:
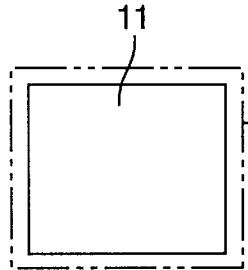
FIGS. 2(A)–2(D) are respective plan views depicting certain relationships between an upstream mark and an illumination beam, according to the first representative embodiment.

Representative relationships between an upstream mark and the illumination beam are depicted in FIGS. 2(A)–2(D). FIG. 2(A) shows the area encompassed by a single exposure unit 11, with the superposed transverse profile of the illumination beam 13. (The exposure-unit area 11 encompasses that portion of the overall reticle pattern transferred from the reticle 1 to the substrate in a given instant of time.) For divided projection exposure, a typical exposure-unit area 11 would be square or rectangular in profile and have an area (on the reticle) of approximately $(100\ \mu m)^2$ to $(1000\ \mu m)^2$. With a demagnification ratio of 4:1, for example, such an exposure unit would illuminate an area of approximately $(25\ \mu m)^2$ to $(250\ \mu m)^2$, respectively, on the substrate. For a shaped-beam single-shot transfer technique such as cell projection, the typical exposure-unit area 11 would measure $(100\ \mu m)^2$ to $(200\ \mu m)^2$ on the reticle. With a demagnification ratio of 25:1, for example, such an exposure unit would illuminate an area of about $(5\ \mu m)^2$ on the substrate. In FIGS. 2(A)–2(D), the upstream marks are formed on the same membrane region of the reticle as the pattern to be projection-transferred to the substrate.

The transverse area of the illumination beam 13 is slightly larger than the exposure unit 11. For example, if the exposure unit 11 were a square measuring 1000 $\mu$m×1000 $\mu$m, then the transverse area of the illumination beam 13 would be a square measuring about 1100 $\mu$m×1100 $\mu$m.

Figure 2B:
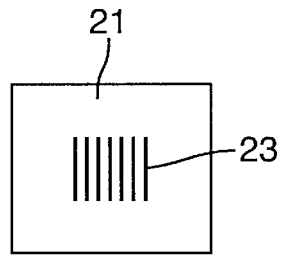

FIG. 2(B) shows a relatively large (relative to the aperture 21) upstream mark 23 that has especial utility for aligning and calibrating the main field of the illumination and imaging optical systems. The mark 23 is configured as a line-and-space pattern in which each line has a width of, by way of example, 1.6 $\mu$m, a length of 50 $\mu$m and spacing therebetween of 3.2 $\mu$m. The illumination beam illuminates the upstream mark 23. As the illumination beam illuminates the mark 23, the portion of the beam passing through the mark is projected onto the substrate (or other suitable location on the substrate plane). The projection is performed such that the projected image of the upstream mark 23 overlays a corresponding "downstream" mark on the substrate (or substrate plane). The image of the upstream mark 23 is scanned onto the downstream mark by the deflector 131 (FIG. 5). The backscattered-electron detector 133 (FIG. 5) detects backscattered electrons propagating from the overlaying marks. Based on the resulting detection signal relative to the scan signal, a measurement is performed in which a mark pattern previously imprinted on the substrate or substrate plane is aligned so as to be in registration with the newly projected mark pattern. Alternatively, a calibration can be performed in which one or more of demagnification ratio, rotation, distortion, lateral position, and focus position, for example, is adjusted as required.

Figure 2C:
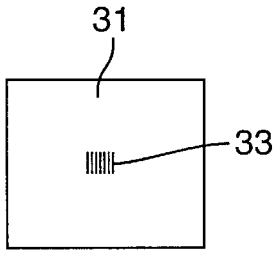
Figure 2D:
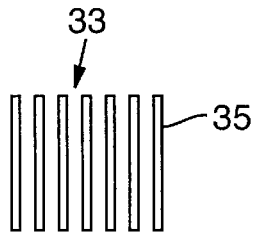

FIG. 2(C) shows a relatively small (relative to the aperture 31) upstream mark 33 that has especial utility for calibrations and corrections of distortion of exposure units as projected onto the substrate. The upstream mark 33 is detailed further in the enlargement shown in FIG. 2(D), in which the mark comprises multiple lines 35 each having, by way of example, a width of several $\mu$m, a length of about 10 $\mu$m, and spaces therebetween each having a width of 2 $\mu$m.

The mark patterns shown in FIGS. 2(B) and 2(C) are significantly smaller than the transverse profile of the illumination beam 13. As a result, many (if not most) of the charged particles in the illumination beam are not used to illuminate the marks per se but rather used to illuminate the vicinity of the marks. I.e., most of the charged particles impinge on the mark member 5 (or the reticle if the upstream marks are defined on the reticle) and cause localized heating and consequent thermal deformation of the mark member (or reticle). Such thermal deformation causes the shapes and positions of the upstream marks (and of the lines or elements thereof) to change. Such changes degrade alignment and calibration accuracy, which degrade the accuracy with which the reticle pattern can be transferred to the substrate. The shields 6, 7 shown in FIG. 1 alleviate this problem.

Figure 3A:
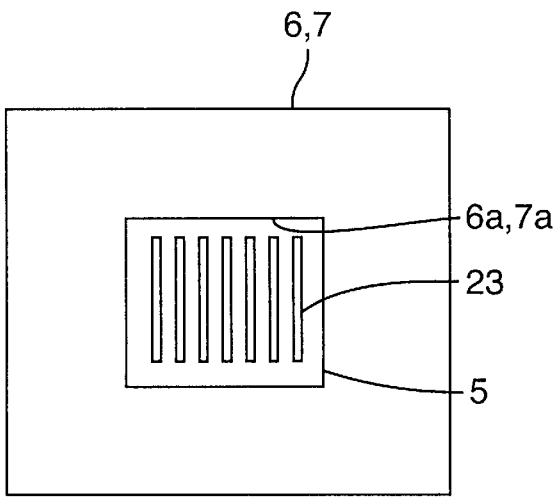
FIGS. 3(A)–(B) are plan views of details of two respective example embodiments of a shield of a CPB projection-exposure system according to the invention.
Figure 3B:
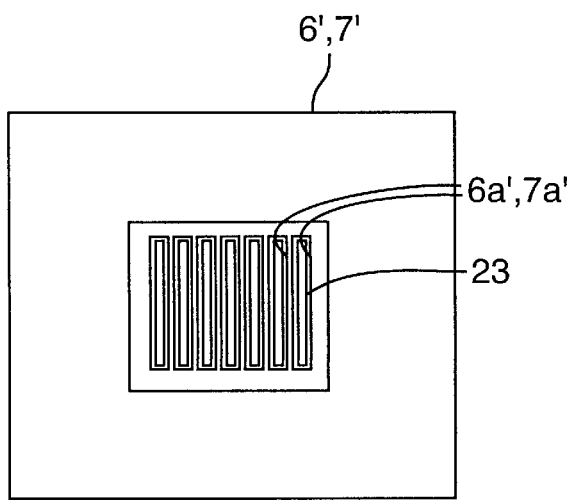

Details of a shield 6, 7 according to two example embodiments are shown in FIGS. 3(A) and 3(B), respectively.

Turning first to FIG. 3(A) the shield 6, 7 is shown in plan view. The perimeter of the shield 6, 7 encloses an area that is larger than the transverse area and profile of the illumination beam 13. For example, if the illumination beam 13 has a 1100 $\mu$m×1100 $\mu$m transverse profile, then the shield 6, 7 has at least a slightly larger area. The center of the shield 6, 7 defines an aperture 6a, 7a measuring, by way of example, 55 $\mu$m×55 $\mu$m. The aperture 6a, 7a is situated such that the upstream mark 23 (which, by way of example occupies an area of approximately 50 $\mu$m×50 $\mu$m) when viewed axially is approximately centered in the aperture 6a, 7a. To illuminate the upstream mark 23, the illumination beam first passes through the aperture 6a, 7a; the shield 6, 7 blocks most of the illumination beam from reaching anything downstream other than the upstream mark 23. As a result, only that portion of the illumination beam that is actually required to illuminate the upstream mark 23 strikes the mark member 5. The amount of heating imparted to the mark member 5 is thus much less than if the shield 6, 7 were absent.

The example embodiment of the shield shown in FIG. 3(B) is especially useful whenever the space between the lines of the upstream mark 23 is relatively wide. Rather than having a single large aperture 6a, 7a, as used in the FIG. 3(A) embodiment, the shield 6', 7' in the FIG. 3(B) embodiment defines individual slit-shaped apertures 6a', 7a' for each respective line of the mark 23. By way of example, each slit-shaped aperture 6a', 7a' has a width of 5.5 $\mu$m and a length of 51 $\mu$m. Thus, each slit-shaped aperture 6a', 7a' is slightly larger than the corresponding line of the mark 23. The FIG. 3(B) configuration further reduces the electron dose received by regions of the mark member 5 (or reticle) outside the upstream mark 23. This, in turn, further reduces thermal deformation of the mark member (or reticle).

Figure 4:
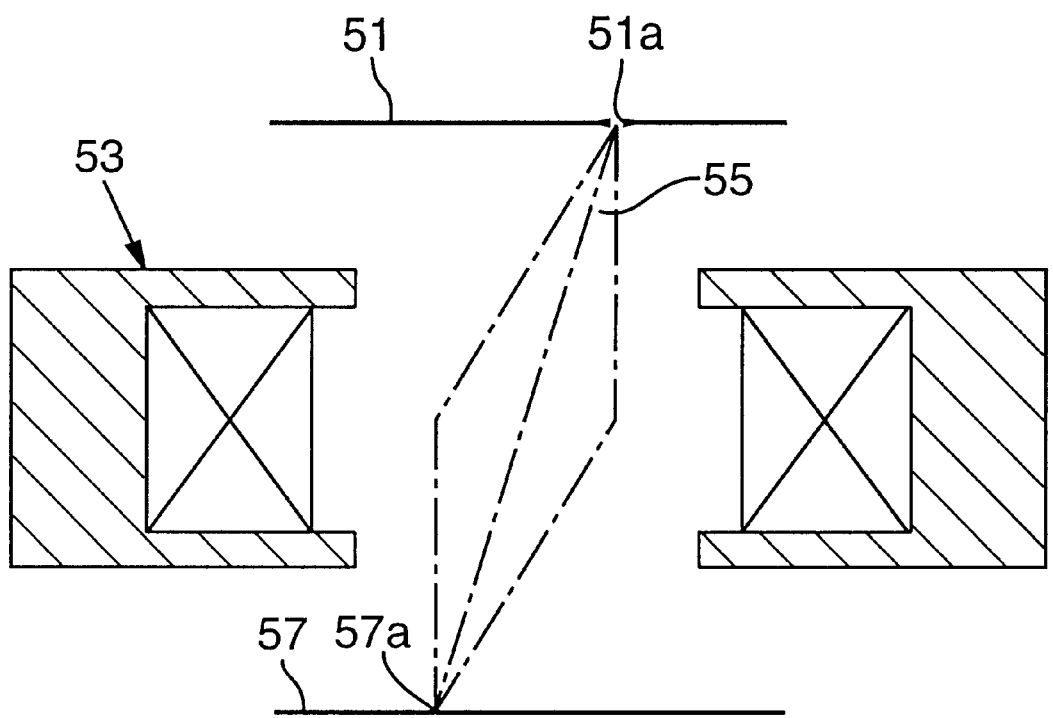
FIG. 4 is an elevational section showing certain features of another representative embodiment in which the illumination beam passes through a lens from the shield to a mark member.

Turning now to FIG. 4 showing another representative embodiment, a shield 51 defining an aperture 51a is axially separated from a mark member 57. I.e., the shield 51 is situated upstream of the mark member 57, and a lens 53 is situated between the shield and the mark member. An illumination beam 55, having passed through the aperture 51a in the shield 51, is projected by the lens 53 onto (and imaged on) an upstream mark 57a on the mark member 57. In this configuration, the upstream mark 57a on the mark member (or reticle) is illuminated selectively by the illumination beam. This avoids thermal deformation of the mark member (or reticle) due to excessive localized irradiation by the illumination beam.

Therefore, the present invention provides a shield situated over a location on a reticle plane (e.g., a mark member or reticle) defining an upstream mark. The shield effects more localized irradiation of the upstream mark during instances in which the upstream mark is being irradiated by the illumination beam. Consequently, excess irradiation of the vicinity of the upstream mark is prevented, which correspondingly reduces thermal deformation of the mark and increases the accuracy of mark detection.

Whereas the invention has been described in connection with multiple representative embodiments, it will be apparent that the invention is not limited to those embodiments. On the contrary, the invention is intended to encompass all alternatives, modifications, and equivalents as may be encompassed within the spirit and scope of the invention as defined by the appended claims.

What is claimed is:

1. A charged-particle-beam projection-exposure apparatus, comprising:

(a) an illumination optical system situated and configured to direct a charged-particle illumination beam along an optical axis from a source to a selected region on a reticle, the reticle being situated at a reticle plane orthogonal to the optical axis;

(b) a projection-optical system situated and configured to direct a charged-particle imaging beam from the reticle to a sensitized substrate so as to transfer the pattern portion defined by the selected exposure unit to the substrate;

(c) at least one upstream mark situated on the reticle plane so as to be selectively irradiated by the illumination beam; and (d) a shield situated between the source and the upstream mark, the shield defining an aperture that transmits a portion of the illumination beam to the upstream mark while blocking other portions of the illumination beam.

2. The apparatus of claim 1, wherein the upstream mark is situated on the reticle.

3. The apparatus of claim 2, wherein:

the reticle comprises multiple upstream marks distributed over the reticle; and the shield defines multiple apertures each corresponding to a respective individual upstream mark on the reticle.

4. The apparatus of claim 1, further comprising a mark member separate from the reticle, wherein at least one upstream mark is situated on the mark member.

5. The apparatus of claim 4, wherein the shield extends over the mark member.

6. The apparatus of claim 1, wherein the upstream mark comprises multiple mark portions.

7. The apparatus of claim 6, wherein the aperture defined by the shield is sized, whenever the aperture is registered axially with the upstream mark, to circumscribe all the mark portions collectively.

8. The apparatus of claim 6, wherein the shield defines multiple apertures each corresponding to a respective individual mark portion.

9. The apparatus of claim 1, wherein the shield is situated between the illumination-optical system and the upstream mark.

* * * * *

UNITED STATES PATENT AND TRADEMARK OFFICE
CERTIFICATE OF CORRECTION

PATENT NO. : 6,207,962 B1
DATED : March 27, 2001
INVENTOR(S) : Teruaki Okino

It is certified that error appears in the above-identified patent and that said Letters Patent is hereby corrected as shown below:

<u>Column 5,</u>
Line 49, change "113 and, respectively," to -- 113, respectively, and --

Signed and Sealed this

Seventh Day of May, 2002

*Attest:*

*Attesting Officer*

JAMES E. ROGAN
*Director of the United States Patent and Trademark Office*